United States Patent
Tateoka et al.

(10) Patent No.: US 12,104,265 B2
(45) Date of Patent: Oct. 1, 2024

(54) ROUGHENED COPPER FOIL, COPPER-CLAD LAMINATE AND PRINTED WIRING BOARD

(71) Applicant: MITSUI MINING & SMELTING CO., LTD., Tokyo (JP)

(72) Inventors: Ayumu Tateoka, Nantou (TW); Tsubasa Kato, Nantou (TW); Shota Kawaguchi, Ageo (JP); Po Chun Yang, Nantou (TW)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 18/284,630

(22) PCT Filed: Mar. 17, 2022

(86) PCT No.: PCT/JP2022/012433
§ 371 (c)(1),
(2) Date: Sep. 28, 2023

(87) PCT Pub. No.: WO2022/209990
PCT Pub. Date: Oct. 6, 2022

(65) Prior Publication Data
US 2024/0175162 A1    May 30, 2024

(30) Foreign Application Priority Data

Mar. 29, 2021   (JP) .................. 2021-056020

(51) Int. Cl.
*B32B 3/00*    (2006.01)
*C25D 1/04*    (2006.01)
(Continued)

(52) U.S. Cl.
CPC ............ *C25D 1/04* (2013.01); *C25D 5/605* (2020.08); *H05K 1/09* (2013.01)

(58) Field of Classification Search
CPC .... H05K 1/09; B32B 3/02; B32B 3/10; B32B 2307/538; B32B 2457/08
See application file for complete search history.

(56) References Cited

U.S. PATENT DOCUMENTS

2012/0285734 A1   11/2012   Uno et al.
2018/0288884 A1*  10/2018   Ori ....................... H05K 3/4655

FOREIGN PATENT DOCUMENTS

JP   2011-168887 A   9/2011
JP   2015-105421 A   6/2015
(Continued)

*Primary Examiner* — Elizabeth E Mulvaney
(74) *Attorney, Agent, or Firm* — GREENBLUM & BERNSTEIN, P.L.C.

(57) ABSTRACT

Provided is a roughened copper foil capable of achieving both excellent transmission characteristics and suppression of powdering. This roughened copper foil includes a roughened surface on at least one side. The roughened surface has a roughness slope $\tan\theta$ of 0.58 or less as calculated based on a mean height Rc (μm) and a mean width RSm (μm) of profile elements by formula $Rc/(0.5 \times RSm)$, and a sharpness index $Rc \times Sku$ of 2.35 or less that is a product of the mean height Rc (μm) and a kurtosis Sku. Rc and RSm are values measured in accordance with JIS B0601-2013 under a condition of not performing a cutoff by a cutoff value λs and a cutoff value λc, and Sku is a value measured in accordance with ISO 25178 under a condition of not performing a cutoff using an S filter and an L filter.

10 Claims, 1 Drawing Sheet

(51) Int. Cl.
*C25D 5/00* (2006.01)
*H05K 1/09* (2006.01)

(56) References Cited

FOREIGN PATENT DOCUMENTS

| | | |
|---|---|---|
| JP | 2020-011426 A | 1/2020 |
| WO | 2014/133164 A1 | 9/2014 |
| WO | 2016/117587 A1 | 7/2016 |
| WO | 2018/110579 A1 | 6/2018 |

\* cited by examiner

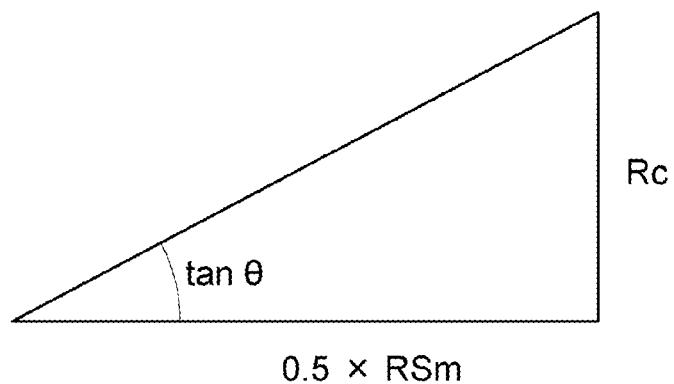

ROUGHENED COPPER FOIL, COPPER-CLAD LAMINATE AND PRINTED WIRING BOARD

TECHNICAL FIELD

The present invention relates to a roughened copper foil, a copper-clad laminate, and a printed wiring board.

BACKGROUND ART

In a manufacturing process of a printed wiring board, a copper foil is widely used in the form of a copper-clad laminate obtained by bonding the copper foil to an insulating resin substrate. In this respect, the copper foil and the insulating resin substrate are desired to have high adhesion to each other in order to prevent occurrence of peeling of wiring during the manufacture of the printed wiring board. Therefore, in an ordinary copper foil for manufacturing a printed wiring board, the bonding surface of the copper foil is subjected to roughening treatment to form irregularities composed of fine copper particles, and these irregularities are allowed to bite into an insulating resin substrate by pressing to exhibit an anchor effect to improve the adhesion.

With high-functionalization of portable electronic devices and the like in recent years, frequencies of signals, irrespective of digital or analog signals, have been increased for the purpose of high-speed processing of large-capacity data, and printed wiring boards suitable for high-frequency applications are required. In such printed wiring boards for high frequencies, transmission loss is desirably suppressed in order to enable transmission without deteriorating high-frequency signals. A printed wiring board comprises a copper foil processed into a wiring pattern and an insulating substrate, and main losses in the transmission loss include conductor loss caused by the copper foil and dielectric loss caused by the insulating substrate.

The conductor loss can be increased by a skin effect of a copper foil that appears more remarkably as the frequency increases. Thus, in order to suppress transmission loss in high-frequency applications, micronization of roughening particles is required for the purpose of suppressing the skin effect of a copper foil. As a copper foil having such fine roughening particles, Patent Literature 1 (WO2014/133164) for example discloses a surface-treated copper foil comprising a black-roughened surface roughened by fixing copper particles (for example, approximately spherical copper particles) having a particle size of 10 nm or larger and 250 nm or smaller. Further, Patent Literature 2 (JP2011-168887A) discloses, as a copper foil excellent in transmission characteristics in a high-frequency region, a roughened copper foil having a roughened surface having a surface roughness Rz after roughened treatment of 1.1 μm or less.

CITATION LIST

Patent Literature

Patent Literature 1: WO2014/133164
Patent Literature 2: JP2011-168887A

SUMMARY OF INVENTION

As described above, in order to improve transmission characteristics (high-frequency characteristics), fine roughening treatments have been attempted on the bonding surface of a copper foil to an insulating resin substrate. However, when a copper foil is merely subjected to micro-roughening treatment, there is a problem that detachment of micro-roughening particles (so-called powdering) due to physical contact is likely to occur.

The present inventors have now discovered that by controlling, in the surface of a roughened copper foil, a roughness slope tan θ calculated based on a mean height Rc and a mean width RSm of profile elements, and a sharpness index calculated based on the mean height Rc and a kurtosis Sku in predetermined ranges respectively, both excellent transmission characteristics and suppression of powdering can be achieved.

Therefore, it is an object of the present invention to provide a roughened copper foil that can provide both excellent transmission characteristics and suppression of powdering.

According to an aspect of the present invention, there is provided a roughened copper foil comprising a roughened surface on at least one side,
wherein the roughened surface has a roughness slope tan θ of 0.58 or less as calculated based on a mean height Rc (μm) and a mean width RSm (μm) of profile elements by formula Rc/(0.5×RSm), and
wherein the roughened surface has a sharpness index Rc×Sku of 2.35 or less that is a product of the mean height Rc (μm) and a kurtosis Sku,
wherein Rc and RSm are values measured in accordance with JIS B0601-2013 under a condition of not performing a cutoff by a cutoff value λs and a cutoff value λc, and Sku is a value measured in accordance with ISO 25178 under a condition of not performing a cutoff using an S filter and an L filter.

According to another aspect of the present invention, there is provided a copper-clad laminate comprising the roughened copper foil.

According to another aspect of the present invention, there is provided a printed wiring board comprising the roughened copper foil.

BRIEF DESCRIPTION OF DRAWINGS

FIG. 1 is a diagram for explaining roughness slope tan θ calculated by a trigonometric function.

DESCRIPTION OF EMBODIMENTS

Definitions

The definitions of terms or parameters used for specifying the present invention are shown below.

As used herein, "mean height Rc" or "Rc" is a parameter that represents the mean of heights of profile elements in a sampling length, measured in accordance with JIS B0601-2013.

As used herein, "mean width RSm" or "RSm" is a parameter that represents the mean of widths of profile elements in a sampling length, measured in accordance with JIS B0601-2013. The mean width RSm is a parameter for evaluating the size of streaks or particles in a transverse direction, rather than the height of irregularities of the surface.

Regarding the Rc and the RSm, the minimum height and the minimum width are specified for a ridge or dale that constitutes a profile element, and the ridge or dale whose height is 10% or less of the maximum height Rz or whose width is 1% or less of the sampling length is regarded as noise and as a part of a dale or ridge that precedes or follows.

As used herein, "roughness slope tan θ" means a parameter calculated based on the mean height Rc (μm) and the mean width RSm (μm) of the profile elements by formula Rc/(0.5×RSm).

As used herein, "kurtosis Sku" or "Sku" is a parameter that represents the sharpness of a height distribution measured in accordance with ISO 25178. Sku=3 means that the height distribution is a normal distribution, Sku>3 means that a large number of sharp ridges and dales are present at the surface, and Sku<3 means that the surface is flat.

As used herein, "sharpness index" means a parameter calculated by a product of the mean height Rc (μm) and the kurtosis Sku (that is, Rc×Sku).

As used herein, "developed interfacial area ratio Sdr" is a parameter that indicates how much the developed area (surface area) of a defined region increases compared to the area of the defined region, measured in accordance with ISO 25178 and expressed in percentage. A smaller value thereof indicates that the surface profile is closer to a flat surface, and the Sdr of a completely flat surface is 0%. On the other hand, a larger value thereof indicates a rougher surface profile.

As used herein, "arithmetic mean height Sa" or "Sa" is a parameter that represents the mean of absolute values of differences in height at respective points with respect to the average surface of a surface, measured in accordance with ISO 25178. In other words, the "arithmetic mean height Sa" or "Sa" corresponds to a parameter obtained by expanding the arithmetic mean height Ra of a profile to a surface.

As used herein, "root mean square height Sq" or "Sq" is a parameter corresponding to the standard deviation of distances from the mean surface, measured in accordance with ISO 25178. In other words, the "root mean square height Sq" or "Sq" corresponds to a parameter obtained by expanding a root mean square height Rq of a profile to a surface.

RSm and Rc can be calculated respectively by measuring a surface profile of a predetermined measurement length in a roughened surface by a commercially available laser microscope. Sku, Sdr, Sa, and Sq can be calculated respectively by measuring a surface profile of a predetermined measurement area in a roughened surface by a commercially available laser microscope. Herein, the parameters RSm and Rc are measured under a condition of not performing a cutoff by a cutoff value λs and a cutoff value λc, and the parameters Sku, Sdr, Sa, and Sq are measured under a condition of not performing a cutoff using an S filter and an L filter. Besides, preferred conditions in measuring and analyzing a surface profile by a laser microscope will be described later in EXAMPLES.

As used herein, the "electrode surface" of an electrodeposited copper foil refers to the surface on the side in contact with a cathode during the manufacture of the electrodeposited copper foil.

As used herein, the "deposited surface" of an electrodeposited copper foil refers to the surface on the side on which electrolytic copper is deposited during the manufacture of the electrodeposited copper foil, in other words, the surface on the side not in contact with a cathode.

Roughened Copper Foil

The copper foil of the present invention is a roughened copper foil. This roughened copper foil comprises a roughened surface on at least one side thereof. This roughened surface has a roughness slope tan θ of 0.58 or less as calculated based on a mean height Rc (μm) and a mean width RSm (μm) of profile elements by formula Rc/(0.5×RSm). Further, the roughened surface has a sharpness index Rc×Sku of 2.35 or less that is a product of the mean height Rc (μm) and the kurtosis Sku. By controlling the roughness slope tan θ calculated based on the mean height Rc and the mean width RSm of the profile elements, and the sharpness index calculated based on the mean height Rc and the kurtosis Sku in predetermined ranges respectively in this manner in the surface of the roughened copper foil, both excellent transmission characteristics and suppression of powdering can be achieved.

As described above, in order to improve transmission characteristics (high-frequency characteristics), fine roughening treatments have been attempted on the bonding surface of a copper foil to an insulating resin substrate. However, when a copper foil is merely subjected to micro-roughening treatment, there is a problem that powdering is likely to occur. It is conceivable to improve the transmission characteristics by subjecting a smooth electrode surface of an electrodeposited copper foil in particular to micro-roughening treatment, but the occurrence of powdering may be more remarkable on such a smooth electrode surface. As just described above, it is not easy to achieve both excellent transmission characteristics and suppression of powdering.

Facing this problem, the present inventors have conducted studies and found that the transmission characteristics relate to the roughness slope tan θ of the roughened surface and the occurrence of powdering relates to the sharpness index of the roughened surface. These mechanisms are not necessarily certain, but it is conceivable as follows. Here, FIG. 1 shows the roughness slope tan θ calculated by a trigonometric function. As shown in FIG. 1, the roughness slope tan θ is calculated by formula Rc/(0.5×RSm), in other words, corresponds to angles of ridges or dales in the roughened surface. Specifically, as the roughness slope tan θ is smaller, these angles are smaller (in other words, ridges or dales slope more gently), and therefore a current flows more smoothly. To the contrary, as the roughness slope tan θ is larger, these angles are larger, and therefore the resistance is larger (in other words, the current resistance increases). Thus, it is conceivable that by controlling the roughness slope tan θ in small values of 0.58 or less, excellent transmission characteristics can be achieved. The sharpness index corresponds to the height and sharpness of the ridges or dales in the roughened surface. Specifically, as the sharpness index is larger, a larger number of high and sharp ridges or dales are present at the roughened surface. In general, as ridges are higher and sharper, breaking, dropping, or the like of nodules (roughening particles) in the roughened surface is more likely to occur. Thus, it is considered that by controlling the sharpness index in small values of 2.35 or less, breaking, dropping, or the like of nodules is effectively prevented. As a result, according to the roughened copper foil of the present invention, both excellent transmission characteristics and suppression of powdering can be achieved.

Therefore, the roughened surface of the roughened copper foil has a roughness slope tan θ of 0.58 or less, preferably 0.05 or more and 0.45 or less, more preferably 0.07 or more and 0.35 or less, and further preferably 0.10 or more and 0.30 or less.

Further, the roughened surface of the roughened copper foil has a sharpness index of 2.35 or less, preferably 0.05 or more and 2.00 or less, more preferably 1.00 or more and 2.00 or less, and further preferably 1.30 or more and 2.00 or less.

In the roughened copper foil, the roughened surface preferably has a developed interfacial area ratio Sdr of 15.0% or more and 30.0% or less, more preferably 15.0% or more and 28.0% or less, further preferably 15.0% or more and 27.0% or less, and particularly preferably 15.0% or more and 26.0% or less. When the roughened surface has Sdr within the above ranges, more excellent transmission characteristics can be achieved while powdering is effectively prevented.

In the roughened copper foil, the roughened surface preferably has a mean height Rc of 0.40 μm or more and 0.60 μm or less, and more preferably 0.40 μm or more and 0.50 μm or less. When the roughened surface has Rc within the above ranges, the roughness slope tan θ and the sharpness index are easily controlled in the above-described ranges, and more excellent transmission characteristics can be achieved while powdering is effectively prevented.

In the roughened copper foil, the roughened surface preferably has an arithmetic mean height Sa of 0.15 μm or more and 0.33 μm or less, more preferably 0.15 μm or more and 0.31 μm or less, and further preferably 0.16 μm or more and 0.25 μm or less. When the roughened surface has Sa within the above ranges, more excellent transmission characteristics can be achieved while powdering is effectively prevented.

In the roughened copper foil, the roughened surface preferably has a root mean square height Sq of 0.23 μm or more and 0.40 μm or less, more preferably 0.23 μm or more and 0.35 μm or less, and further preferably 0.23 μm or more and 0.28 μm or less. When the roughened surface has Sq within the above ranges, more excellent transmission characteristics can be achieved while powdering is effectively prevented.

In the roughened copper foil, the roughened surface preferably has a mean width RSm of the profile elements of 2.80 μm or more and 6.00 μm or less, more preferably 2.80 μm or more and 5.50 μm or less, and further preferably 3.50 μm or more and 4.80 μm or less. When the roughened surface has RSm within the above ranges, the roughness slope tan θ is easily controlled in the above-described ranges, and while powdering is effectively prevented, the shapes of ridges or dales in the roughened surface are sufficiently gentle, so that more excellent transmission characteristics can be achieved.

In the roughened copper foil, the roughened surface typically has a kurtosis Sku of 2.50 or more and 4.00 or less, more typically 2.70 or more and 4.00 or less, and further typically 2.90 or more and 4.00 or less. When the roughened surface has Sku within the above ranges, the sharpness index is easily controlled in the above-described ranges. As described above, Sku is a parameter that represents the sharpness of a height distribution, which is a probability distribution, and therefore Sku does not necessarily correspond to the influence on powdering. In other words, it is difficult to control an occurrence of powdering in the roughened copper foil by Sku alone. In contrast, in the present invention, by controlling the sharpness index that is a parameter in which Rc and Sku are combined (Rc×Sku) in a predetermined range, powdering of the roughened copper foil can be effectively suppressed as described above.

The thickness of the roughened copper foil is not particularly limited but is preferably 0.1 μm or more and 210 μm or less, and more preferably 0.5 μm or more and 70 μm or less. The roughened copper foil of the present invention is not limited to one obtained by subjecting a surface of an ordinary copper foil to roughening treatment and may be one obtained by subjecting the copper foil surface of a carrier-attached copper foil to roughening treatment or micro-roughening treatment.

The roughened copper foil of the present invention can be preferably manufactured by subjecting a smooth copper foil surface (for example, an electrode surface of an electrode-posited copper foil) to roughening treatment under desired low-roughening conditions to form fine roughening particles. Therefore, according to a preferred aspect of the present invention, the roughened copper foil is an electrode-posited copper foil, and the roughened surface is present on the electrode surface side of the electrodeposited copper foil. The roughened copper foil may have roughened surfaces on both sides or may have a roughened surface only on one side. The roughened surface typically comprises a plurality of roughening particles, and these plurality of roughening particles are each preferably a copper particle. The copper particle may be composed of metal copper or a copper alloy.

The roughening treatment for forming the roughened surface can be preferably carried out by forming roughening particles out of copper or a copper alloy on a copper foil. The copper foil before performing the roughening treatment may be a non-roughened copper foil or may be one subjected to preliminary roughening. The surface of the copper foil to be subjected to the roughening treatment preferably has a ten-point average roughness Rz of 0.50 μm or more and 1.50 μm or less, and more preferably 0.60 μm or more and 1.50 μm or less, as measured in accordance with JIS B0601-1994. When the Rz is within the above ranges, a surface profile required for the roughened copper foil of the present invention is easily provided to the roughened surface.

In the roughening treatment, it is preferred to perform electrolytic deposition, for example, at a temperature of 20° C. or higher and 40° C. or lower at 1 A/dm² or more and 7 A/dm² or less in a copper sulfate solution having a copper concentration of 3 g/L or more and 20 g/L or less and a sulfuric acid concentration of 50 g/L or more and 200 g/L or less. This electrolytic deposition is preferably performed for 0.5 seconds or longer and 30 seconds or shorter, more preferably 1 seconds or longer and 30 seconds or shorter, and further preferably 1 seconds or longer and 3 seconds or shorter. At this time, it is preferred to set the amount of roughening treatment (amount of coulomb) represented by a product of a current density (A/dm²) and an electrolysis time (seconds) to 50 C/dm² or less, and more preferably 3 C/dm² or more and 30 C/dm² or less.

When the electrolytic deposition is performed, it is preferred to set the amount of copper to be supplied between electrodes to 0.1 [(g·m)/(min·L)] or more and 15.0 [(g·m)/(min·L)] or less, and more preferably 0.1 [(g·m)/(min·L)] or more and 10.0 [(g·m)/(min·L)] or less, wherein the amount of copper to be supplied between electrodes is defined by the following formula:

$$F_{Cu} = F_{CuSO4} \times C_{Cu}/S$$

wherein $F_{Cu}$ represents the amount of copper [(g·m)/(min·L)] to be supplied between electrodes, $F_{CuSO4}$ represents a flow rate (m³/min) of the copper sulfate solution, $C_{Cu}$ represents the copper concentration (g/L) of the copper sulfate solution, and S represents a cross-sectional area (m²) between the anode and the cathode. Thus, a surface profile required for the roughened copper foil of the present invention is easily provided to the surface of the roughened copper foil. However, the roughened copper foil according to the present invention may be one manufactured by any method not limited to the above method.

The roughening treatment preferably further includes the second roughening treatment of subjecting the surface after the above roughening treatment (first roughening treatment) to electrolytic deposition under predetermined conditions.

By performing roughening treatment including the first roughening treatment and the second roughening treatment, the growth of nodules in the vertical direction (height direction) can be suppressed, and thereby a surface profile required for the roughened copper foil of the present invention is more easily provided to the surface of the roughened copper foil. The amount of roughening treatment (amount of coulomb) in the second roughening treatment is preferably 85 C/dm$^2$ or less, and more preferably 30 C/dm$^2$ or more and 80 C/dm$^2$ or less. The preferred conditions described above regarding the first roughening treatment directly apply to the other preferred conditions in the second roughening treatment.

The roughened copper foil may be one which has been subjected to rust proofing treatment to form a rust proofing layer, optionally. The rust proofing treatment preferably comprises plating treatment using zinc. The plating treatment using zinc may be either of zinc plating treatment and zinc alloy plating treatment, and for the zinc alloy plating treatment, zinc-nickel alloy treatment is particularly preferred. The zinc-nickel alloy treatment should be plating treatment including at least Ni and Zn and may further include other elements such as Sn, Cr, Co, and Mo. For example, when the rust proofing layer further comprises Mo in addition to Ni and Zn, thereby the treated surface of the roughened copper foil is more excellent in adhesion to a resin, chemical resistance, and heat resistance, and etching residues are unlikely to be left on the treated surface of the roughened copper foil. The Ni/Zn fixing ratio in the zinc-nickel alloy plating is preferably in the range of 1.2 or more and 10 or less, more preferably in the range of 2 or more and 7 or less, and further preferably 2.7 or more and 4 or less, in terms of mass ratio. The rust proofing treatment preferably further includes chromate treatment, and this chromate treatment is more preferably performed on the zinc-containing surface of plating after plating treatment using zinc. Thus, the rust proofing properties can be further improved. Particularly preferred rust proofing treatment is a combination of zinc-nickel alloy plating treatment and subsequent chromate treatment.

The roughened copper foil may be one a surface of which has been subjected to silane coupling agent treatment to form a silane coupling agent layer thereon, optionally. Thus, the moisture resistance, the chemical resistance, the adhesion to an adhesive, and the like can be improved. The silane coupling agent layer can be formed by appropriately diluting a silane coupling agent, applying the diluted silane coupling agent, and drying it. Examples of the silane coupling agent include epoxy functional silane coupling agents such as 4-glycidylbutyltrimethoxysilane and 3-glycidoxypropyltrimethoxysilane, or amino functional silane coupling agents such as 3-aminopropyltriethoxysilane, N-(2-aminoethyl)-3-aminopropyltrimethoxysilane, N-3-(4-(3-aminopropoxy)butoxy)propyl-3-aminopropyltrimethoxysilane, and N-phenyl-3-aminopropyltrimethoxysilane, or mercapto functional silane coupling agents such as 3-mercaptopropyltrimethoxysilane, or olefin functional silane coupling agents such as vinyltrimethoxysilane and vinylphenyltrimethoxysilane, or acrylic functional silane coupling agents such as 3-methacryloxypropyltrimethoxysilane and 3-acryloxypropyltrimethoxysilane, or imidazole functional silane coupling agents such as imidazolesilane, or triazine functional silane coupling agents such as triazinesilane.

For the above-described reasons, the roughened copper foil preferably further includes a rust proofing layer and/or a silane coupling agent layer on the roughened surface and more preferably includes both a rust proofing layer and a silane coupling agent layer. The rust proofing layer and the silane coupling agent layer may be formed on the roughened surface side of the roughened copper foil and may also be formed on the side on which the roughened surface is not formed.

Copper-Clad Laminate

The roughened copper foil of the present invention is preferably used for the manufacture of a copper-clad laminate for a printed wiring board. In other words, according to a preferred aspect of the present invention, a copper-clad laminate comprising the above roughened copper foil is provided. By using the roughened copper foil of the present invention, both excellent transmission characteristics and high peel strength due to suppression of powdering can be achieved in a copper-clad laminate. This copper-clad laminate comprises the roughened copper foil of the present invention and a resin layer adhered and provided on the roughened surface of this roughened copper foil. The roughened copper foil may be provided on one surface or both surfaces of the resin layer. The resin layer comprises a resin, preferably an insulating resin. The resin layer is preferably a prepreg and/or a resin sheet. A prepreg is a generic term for a composite material obtained by impregnating a substrate such as a synthetic resin plate, a glass plate, a glass woven fabric, a glass nonwoven fabric, or paper with a synthetic resin. Preferred examples of the insulating resin include epoxy resins, cyanate resins, bismaleimide triazine resins (BT resins), polyphenylene ether resins, and phenolic resins. Examples of the insulating resin for forming the resin sheet include insulating resins such as epoxy resins, polyimide resins, and polyester resins. Filler particles composed of various inorganic particles such as silica and alumina particles may be contained in the resin layer in view of, for example, improving insulating properties. The thickness of the resin layer is not particularly limited but is preferably 1 μm or more and 1000 μm or less, more preferably 2 μm or more and 400 μm or less, and further preferably 3 μm or more and 200 μm or less. The resin layer may be composed of a plurality of layers. The resin layer such as a prepreg and/or a resin sheet may be provided on the roughened copper foil via a primer resin layer previously applied to a copper foil surface.

Printed Wiring Board

The roughened copper foil of the present invention is preferably used for the manufacture of a printed wiring board. In other words, according to a preferred aspect of the present invention, a printed wiring board comprising the above roughened copper foil is provided. By using the roughened copper foil of the present invention, both excellent transmission characteristics and high peel strength due to suppression of powdering can be achieved in a printed wiring board. The printed wiring board according to this aspect comprises a layer configuration in which a resin layer and a copper layer are laminated. The copper layer is a layer derived from the roughened copper foil of the present invention. The resin layer is as described above regarding the copper-clad laminate. In any case, in the printed wiring board, a known layer configuration can be adopted. Specific examples of the printed wiring board include single-sided or double-sided printed wiring boards obtained by adhering the roughened copper foil of the present invention to one surface or both surfaces of a prepreg followed by curing to form a laminate, and then forming a circuit, and multilayer printed wiring boards obtained by multilayering the single-sided or double-sided printed wiring boards. Other specific examples include flexible printed wiring boards, COFs, and TAB tapes obtained by forming the roughened copper foil of the present invention on a resin film and forming a circuit. Still other specific examples include: buildup wiring boards obtained by applying the above-described resin layer to the roughened copper foil of the present invention to form a resin-attached copper foil (RCC), laminating the RCC on the above-described printed substrate using the resin layer as an insulating adhesive material layer, and then forming a circuit by a method such as a modified semi-additive process (MSAP) or a subtractive process using the roughened copper foil as all or part of a wiring layer; buildup wiring boards obtained by forming a circuit by a semi-additive process (SAP) by removing the roughened copper foil; and direct-buildup-on-wafers obtained by alternately repeating the lamination of a resin-attached copper foil on a semiconductor integrated circuit and circuit formation.

EXAMPLES

The present invention will be more specifically described by the following examples.

Examples 1 to 10

A roughened copper foil of the present invention was manufactured as follows.
(1) Manufacture of Electrodeposited Copper Foil
In Examples 1, 2 and 4 to 9, electrolysis was performed at a solution temperature of 45° C. and a current density of 55 A/dm$^2$ using a sulfuric acidic copper sulfate solution having the composition shown below as a copper electrolytic solution, an electrode made of titanium for a cathode, and a DSA (dimensionally stable anode) for an anode, to obtain an electrodeposited copper foil A1 having a thickness 18 μm. At this time, an electrode in which the ten-point average roughness Rz of each surface was adjusted to 1.2 μm by polishing the surface with a buff of #1000 was used as the cathode.
<Composition of Sulfuric Acidic Copper Sulfate Solution>
  Copper concentration: 80 g/L
  Sulfuric acid concentration: 300 g/L
  Glue concentration: 5 mg/L
  Chlorine concentration: 30 mg/L
In Example 3, an electrodeposited copper foil A2 having a thickness of 18 μm was obtained by performing electrolysis under the same conditions as the conditions for the electrodeposited copper foil A1 except that an electrode in which the ten-point average roughness Rz of each surface was adjusted to 0.8 μm by polishing the surface with a buff of #2500 was used as the cathode.
In Example 10, an electrodeposited copper foil B having a thickness of 18 μm was obtained using a sulfuric acidic copper sulfate solution having the composition shown below as a copper electrolytic solution. At this time, conditions other than the composition of the sulfuric acidic copper sulfate solution were the same as those for the electrodeposited copper foil A1.
<Composition of Sulfuric Acidic Copper Sulfate Solution>
  Copper concentration: 80 g/L
  Sulfuric acid concentration: 260 g/L
  Bis(3-sulfopropyl) disulfide concentration: 30 mg/L
  Diallyldimethylammonium chloride polymer concentration: 50 mg/L
  Chlorine concentration: 40 mg/L
(2) Roughening Treatment
Among the electrode surface and the deposited surface included in the above-described electrodeposited copper foil, roughening treatment was performed on the electrode surface side for Examples 1 to 9 and on the deposited surface side for Example 10. The ten-point average roughness Rz measured in accordance with JIS B0601-1994 using a contact surface roughness meter for the electrode surfaces of the electrodeposited copper foils used in Examples 1 to 9 and the deposited surfaces of the electrodeposited copper foils used in Example 10 were as shown in Table 1.

In Examples 1 to 6, the first roughening treatment and the second roughening treatment, shown below, were performed in the mentioned order.
  The first roughening treatment was carried out by performing electrolysis in a copper electrolytic solution for roughening treatment (copper concentration: 3 g/L or more and 20 g/L or less, sulfuric acid concentration: 50 g/L or more and 200 g/L or less, liquid temperature: 30° C.) under the conditions of a current density, a time, an amount of copper supplied between electrodes, and an amount of coulomb (current density×time), shown in Table 1 for every example, and then rinsing with water.
  The second roughening treatment was carried out by performing electrolysis in a copper electrolytic solution for roughening treatment having the same composition as in the first roughening treatment under the conditions of a current density, a time, an amount of copper supplied between electrodes, and an amount of coulomb, shown in Table 1 for every example, and then rinsing with water.
In Examples 7 and 10, the first roughening treatment, the second roughening treatment, and the third roughening treatment, shown below, were performed in the mentioned order.
  The first roughening treatment was carried out by performing electrolysis in a copper electrolytic solution for roughening treatment (copper concentration: 3 g/L or more and 20 g/L or less, sulfuric acid concentration: 50 g/L or more and 200 g/L or less, liquid temperature: 30° C.) under the conditions of a current density, a time, an amount of copper supplied between electrodes, and an amount of coulomb, shown in Table 1 for every example, and then rinsing with water.
  The second roughening treatment was carried out by performing electrolysis in a copper electrolytic solution for roughening treatment having the same composition as in the first roughening treatment under the conditions of a current density, a time, an amount of copper supplied between electrodes, and an amount of coulomb, shown in Table 1 for every example, and then rinsing with water.
  The third roughening treatment was carried out by performing electrolysis in a copper electrolytic solution for roughening treatment (copper concentration: 65 g/L or more and 80 g/L or less, sulfuric acid concentration: 50 g/L or more and 200 g/L or less, liquid temperature: 45° C.) under the conditions of a current density, a time, and an amount of copper supplied between electrodes, shown in Table 1 for every example, and then rinsing with water.
In Examples 8 and 9, the roughening treatment (first roughening treatment) shown below was performed. This roughening treatment was carried out by performing electrolysis in a copper electrolytic solution for roughening treatment (copper concentration: 3 g/L or more and 20 g/L or less, sulfuric acid concentration: 50 g/L or more and 200 g/L or less, liquid temperature: 30° C.) under the conditions of a current density, a time, an amount of copper supplied between electrodes, and an amount of coulomb shown in Table 1 for every example, and then rinsing with water.

(3) Rust Proofing Treatment

The electrodeposited copper foil after roughening treatment was subjected to rust proofing treatment shown in Table 1. In Examples 3 to 6 and 10, both surfaces of the electrodeposited copper foil were subjected to zinc-nickel-based rust proofing treatment using a pyrophosphoric acid bath at a potassium pyrophosphate concentration of 80 g/L, a zinc concentration of 0.2 g/L, a nickel concentration of 2 g/L, a liquid temperature of 40° ° C., and a current density of 0.5 A/dm² as this rust proofing treatment. In contrast, in Examples 1, 2 and 7 to 9, the surface where roughening treatment of the electrodeposited copper foil had been performed was subjected to zinc-nickel-molybdenum-based rust proofing treatment at a potassium pyrophosphate concentration of 100 g/L, a zinc concentration of 1 g/L, a nickel concentration of 2 g/L, a molybdenum concentration of 1 g/L, a liquid temperature of 40° C., and a current density of 0.5 A/dm². In Examples 1, 2 and 7 to 9, the surface where roughening treatment of the electrodeposited copper foil had not been performed was subjected to zinc-nickel-based rust proofing treatment under the same conditions as in Examples 3 to 6 and 10.

(4) Chromate Treatment

Both surfaces of the electrodeposited copper foil that had been subjected to the above rust proofing treatment were subjected to chromate treatment to form a chromate layer on the rust proofing layer. This chromate treatment was performed under the conditions of a chromic acid concentration of 1 g/L, a pH of 11, a liquid temperature of 25° C., and a current density of 1 A/dm².

(5) Silane Coupling Agent Treatment

The copper foil that had been subjected to the above chromate treatment was rinsed with water, and immediately after that, silane coupling agent treatment was performed to adsorb a silane coupling agent on the chromate layer on the roughened surface. This silane coupling agent treatment was carried out by spraying a silane coupling agent solution containing pure water as a solvent on the roughened surface by showering to perform adsorption treatment. As the silane coupling agent, 3-aminopropyltrimethoxysilane was used in Examples 1, 2, 4, 6, and 7, 3-glycidoxypropyltrimethoxysilane was used in Examples 3 and 8 to 10, and 3-acryloxypropyltrimethoxysilane was used in Example 5. The concentration of the silane coupling agent was each set to 3 g/L. After the silane coupling agent was adsorbed, moisture was finally evaporated by a heater to obtain a roughened copper foil having a predetermined thickness.

TABLE 1

| | Electrodeposited copper foil | | | First roughening treatment | | | | Second roughening treatment | |
|---|---|---|---|---|---|---|---|---|---|
| | Type | Rz (μm) | Treated surface | Current density (A/dm²) | Time (s) | Amount of copper supplied between electrodes (g · m)/(min · L) | Amount of coulomb (C/dm²) Amount | Current density (A/dm²) | Time (s) |
| Ex. 1 | A1 | 1.4 | Electrode surface | 5.6 | 2.7 | 0.1 | 15.3 | 16.9 | 2.7 |
| Ex. 2 | A1 | 1.2 | Electrode surface | 5.6 | 2.7 | 0.1 | 15.3 | 22.6 | 2.7 |
| Ex. 3 | A2 | 0.6 | Electrode surface | 5.6 | 2.7 | 0.1 | 15.3 | 22.6 | 2.7 |
| Ex. 4 | A1 | 1.3 | Electrode surface | 2.8 | 2.7 | 0.1 | 7.7 | 22.6 | 2.7 |
| Ex. 5 | A1 | 1.4 | Electrode surface | 5.6 | 2.7 | 0.1 | 15.3 | 28.2 | 2.7 |
| Ex. 6* | A1 | 1.4 | Electrode surface | 5.6 | 2.7 | 0.1 | 15.3 | 33.9 | 2.7 |
| Ex. 7* | A1 | 1.3 | Electrode surface | 38.4 | 3.2 | 20.8 | 124.6 | 8.5 | 3.2 |
| Ex. 8* | A1 | 1.1 | Electrode surface | 33.9 | 2.7 | 0.1 | 91.5 | — | — |
| Ex. 9* | A1 | 1.3 | Electrode surface | 28.2 | 2.7 | 0.1 | 76.1 | — | — |
| Ex. 10* | B | 0.5 | Deposited surface | 14.7 | 7.4 | 12.2 | 108.8 | 22.0 | 7.4 |

| | Roughening treatment | | | | | | |
|---|---|---|---|---|---|---|---|
| | Second roughening treatment | Third roughening treatment | | | | | |
| | Amount of copper supplied between electrodes (g · m)/(min · L) | Amount of coulomb (C/dm²) | Current density (A/dm²) | Time (s) | Amount of copper supplied between electrodes (g · m)/(min · L) | Rust proofing treatment Type | Si treatment Type |
| Ex. 1 | 0.1 | 45.8 | — | — | — | Zn—Ni—Mo | Amino |
| Ex. 2 | 0.1 | 61.1 | — | — | — | Zn—Ni—Mo | Amino |
| Ex. 3 | 0.1 | 61.1 | — | — | — | Zn—Ni | Epoxy |
| Ex. 4 | 0.1 | 61.1 | — | — | — | Zn—Ni | Amino |
| Ex. 5 | 0.1 | 76.3 | — | — | — | Zn—Ni | Acrylic |
| Ex. 6* | 0.1 | 91.6 | — | — | — | Zn—Ni | Amino |
| Ex. 7* | 20.8 | 27.5 | 0.4 | 13.0 | 118.0 | Zn—Ni—Mo | Amino |
| Ex. 8* | — | — | — | — | — | Zn—Ni—Mo | Epoxy |
| Ex. 9* | — | — | — | — | — | Zn—Ni—Mo | Epoxy |
| Ex. 10* | 12.8 | 162.8 | 4.5 | 29.5 | 106.4 | Zn—Ni | Epoxy |

*indicates a comparative example

Evaluation

For the roughened copper foil manufactured, various evaluations shown below were performed.

(a) Surface Property Parameters of Roughened Surface

The roughened surface of the roughened copper foil was measured in accordance with ISO 25178 or JIS B0601-2013 by surface roughness analysis using a laser microscope. Specific measurement conditions were as shown in Table 2. The analysis was performed for the obtained surface profile of the roughened surface following the conditions shown in Table 2 to calculate RSm, Rc, Sdr, Sa, Sq and Sku. The roughness slope tan $\theta(=Rc/(0.5\times RSm))$ was calculated based on the obtained values of RSm and Rc, and the value of the sharpness index ($=Rc\times Sku$) was calculated based on the values of Rc and Sku. The results were as shown in Table 3.

TABLE 2

| Measurement conditions | Model of laser microscope | | Manufactured by Olympus Corporation, OLS-5000 |
|---|---|---|---|
| | Objective lens magnification | | 100× |
| | Optical zoom | | 2× |
| | Direction of observation | | Direction in which treatment streaks of the copper foil are perpendicular to the visual field |
| | Measurement method | | Specify the multiple area mode; specify X = 2 and Y = 2 as "Matrix," and X = 64 μm and Y = 64 μm as "Pitch," in the lattice registering mode; and measure mutually adjacent regions of 2 × 2 (64 μm square per region) |
| Analysis conditions | Common conditions | Surface profile capturing region | 64.419 μm in length × 64.397 μm in width (Specify a region of 1024 pixels × 1024 pixels on the region-specifying screen) |
| | | Correction of surface slope | Perform by "Auto" |
| | | Averaging method | Take an average of measured values of the regions of 2 × 2 simultaneously measured |
| | RSm Rc | Target region | Draw three lines of 64.397 μm in length perpendicularly to treatment streaks, and three lines of 64.419 μm in length in parallel with treatment streaks, and calculate profiles on respective lines to take an average |
| | | Standard | JIS B0601-2013 |
| | | Cutoff value λs | None |
| | | Cutoff value λc | None |
| | Sdr Sa Sq Sku | Target region | Whole region specified in capturing the surface profile (the region of 1024 pixels × 1024 pixels) |
| | | Standard | ISO 25178 |
| | | F-operation | Form-removing method is set to "multidimensional curved surface," and dimension is set to "1." |
| | | S filter | None |
| | | L filter | None |

(b) Peel Strength between Copper Foil and Substrate

As the insulating substrate, two sheets of prepregs (thickness 100 μm) each containing a polyphenylene ether, triallyl isocyanurate, and a bismaleimide resin as main components were prepared and stacked. The roughened copper foil manufactured was laminated on these stacked prepregs such that the roughened surface of the roughened copper foil came into contact with the prepreg, and pressing at 32 kgf/cm² and 205° C. for 120 minutes was performed to manufacture a copper-clad laminate. Subsequently, a circuit was formed on this copper-clad laminate by an etching method to manufacture a test substrate including a linear circuit having a width of 3 mm. The linear circuit thus obtained was peeled off from the insulating substrate in accordance with the A method (90° peel) of JIS C 5016-1994 to measure the peel strength (kgf/cm) in a normal state. The results were as shown in Table 3.

(c) Transmission Characteristics

A substrate for high frequencies (manufactured by Panasonic Corporation, MEGTRON6N) was prepared as an insulating resin substrate. The roughened copper foil was laminated on both surfaces of this insulating resin substrate such that the roughened surface thereof came into contact with the insulating resin substrate using a vacuum press machine under the conditions of a temperature of 190° C. and a press time of 120 minutes to obtain a copper-clad laminate having an insulation thickness of 136 μm. Thereafter, the copper-clad laminate was etched to obtain a substrate for transmission loss measurement on which a microstrip line was formed such that the characteristic impedance was to be 50Ω. The transmission loss (dB/cm) at 20 GHz was measured for the obtained substrate for transmission loss measurement using a network analyzer (manufactured by Keysight Technologies, N5225B). The obtained transmission loss was graded and evaluated by the following criteria. The results were as shown in Table 3.

<Transmission Loss Evaluation Criteria>

Grade A (Excellent): the transmission loss is −0.23 dB/cm or more

Grade B (Good): the transmission loss is −0.24 dB/cm or more and less than −0.23 dB/cm Grade C (Poor): the transmission loss is less than −0.24 dB/cm (d) Powdering Test A powdering test for the roughened copper foil was performed in accordance with IPC-TM-650. Specifically, a filter paper (manufactured by ADVANTEC TOYO KAISHA, LTD., No. 2) of 10 cm×3 cm was disposed on the roughened surface of the roughened copper foil manufactured, and a 250 g weight having a diameter of 2 cm was put on the filter paper, and then the filter paper was slidden by 15 cm in a horizontal direction. Thereafter, the transfer state of the roughening particles (copper particles) on the surface of the filter paper was observed to determine the powdering grade (1 to 4) by the following criteria. When the powdering grade was 1 or 2, powdering was determined to be acceptable, and in the other cases, powdering was determined to be not acceptable. The results are as shown in Table 3.

<Powdering Grade Determination Criteria>
- Grade 1: Roughening particles are not transferred to the filter paper at all, or an extremely small amount of roughening particles are transferred
- Grade 2: a small amount of roughening particles are transferred to the filter paper
- Grade 3: a medium amount of roughening particles are transferred to the filter paper
- Grade 4: a large amount of roughening particles are transferred to the filter paper

TABLE 3

| | Surface property parameters of roughened surface | | | | | | | Peel strength between copper foil and substrate | Transmission characteristics | |
|---|---|---|---|---|---|---|---|---|---|---|
| | RSm (μm) | Rc (μm) | Roughness slope tan θ Rc/0.5RSm (—) | Sdr (%) | Sa (μm) | Sq (μm) | Sku (—) | sharpness index Rc × Sku | Peel strength (kgf/cm) in normal state | Transmission loss (dB/cm) at 20 GHz | Powdering Grade |
| Ex. 1 | 3.826 | 0.427 | 0.223 | 15.4 | 0.20 | 0.26 | 3.46 | 1.48 | 0.54 | −0.22 (A) | 1 (Acceptable) |
| Ex. 2 | 5.680 | 0.748 | 0.263 | 23.6 | 0.32 | 0.40 | 2.89 | 2.17 | 0.55 | −0.23 (A) | 2 (Acceptable) |
| Ex. 3 | 2.819 | 0.473 | 0.336 | 27.6 | 0.18 | 0.23 | 3.40 | 1.61 | 0.54 | −0.23 (A) | 1 (Acceptable) |
| Ex. 4 | 4.574 | 0.767 | 0.335 | 28.5 | 0.33 | 0.40 | 2.60 | 1.99 | 0.54 | −0.23 (A) | 1 (Acceptable) |
| Ex. 5 | 3.905 | 0.598 | 0.306 | 26.8 | 0.24 | 0.30 | 3.29 | 1.97 | 0.55 | −0.24 (B) | 1 (Acceptable) |
| Ex. 6* | 3.766 | 0.739 | 0.339 | 31.0 | 0.26 | 0.33 | 3.34 | 2.47 | 0.56 | −0.24 (B) | 3 (Not acceptable) |
| Ex. 7* | 4.015 | 0.933 | 0.465 | 46.9 | 0.36 | 0.45 | 2.83 | 2.64 | 0.57 | −0.23 (A) | 3 (Not acceptable) |
| Ex. 8* | 3.976 | 0.976 | 0.491 | 50.0 | 0.38 | 0.48 | 2.99 | 2.92 | 0.54 | −0.23 (A) | 4 (Not acceptable) |
| Ex. 9* | 5.573 | 1.131 | 0.406 | 43.1 | 0.51 | 0.67 | 3.70 | 4.18 | 0.54 | −0.23 (A) | 4 (Not acceptable) |
| Ex. 10* | 2.494 | 0.710 | 1.771 | 59.6 | 0.26 | 0.33 | 3.25 | 2.31 | 0.62 | −0.25 (C) | 1 (Acceptable) |

*indicates a comparative example.

The invention claimed is:

1. A roughened copper foil comprising a roughened surface on at least one side,
    wherein the roughened surface has a roughness slope tan θ of 0.58 or less as calculated based on a mean height Rc (μm) and a mean width RSm (μm) of profile elements by formula Rc/(0.5×RSm), and
    wherein the roughened surface has a sharpness index Rc×Sku of 2.35 or less that is a product of the mean height Rc (μm) and a kurtosis Sku,
    wherein Rc and RSm are values measured in accordance with JIS B0601-2013 under a condition of not performing a cutoff by a cutoff value λs and a cutoff value λc, and Sku is a value measured in accordance with ISO 25178 under a condition of not performing a cutoff using an S filter and an L filter.

2. The roughened copper foil according to claim 1, wherein the roughened surface has a developed interfacial area ratio Sdr of 15.0% or more and 30.0% or less, wherein Sdr is a value measured in accordance with ISO 25178 under a condition of not performing a cutoff using the S filter and the L filter.

3. The roughened copper foil according to claim 1, wherein the roughened surface has the mean height Rc of 0.40 μm or more and 0.60 μm or less.

4. The roughened copper foil according to claim 1, wherein the roughened surface has an arithmetic mean height Sa of 0.15 μm or more and 0.33 μm or less, wherein Sa is a value measured in accordance with ISO 25178 under a condition of not performing a cutoff using the S filter and the L filter.

5. The roughened copper foil according to claim 1, wherein the roughened surface has a root mean square height Sq of 0.23 μm or more and 0.40 μm or less, wherein Sq is a value measured in accordance with ISO 25178 under a condition of not performing a cutoff using the S filter and the L filter.

6. The roughened copper foil according to claim 1, wherein the roughened surface has the mean width RSm of the profile elements of 2.80 μm or more and 6.00 μm or less.

7. The roughened copper foil according to claim 1, further comprising a rust proofing layer and/or a silane coupling agent layer on the roughened surface.

8. The roughened copper foil according to claim 1, wherein the roughened copper foil is an electrodeposited copper foil, and the roughened surface is present on an electrode side of the electrodeposited copper foil.

9. A copper-clad laminate comprising the roughened copper foil according to claim 1.

10. A printed wiring board comprising the roughened copper foil according to claim 1.

* * * * *